United States Patent

Christensen et al.

[11] Patent Number: 5,951,707
[45] Date of Patent: Sep. 14, 1999

[54] METHOD OF PARTITIONING CRC CALCULATION FOR A LOW-COST ATM ADAPTER

[75] Inventors: Kenneth Jussi Christensen, Tampa, Fla.; Steven Eric Polge, Cary; Allen Leonid Roginsky, Durham, both of N.C.

[73] Assignee: International Business Machines Corporation, Armonk, N.Y.

[21] Appl. No.: 08/884,540

[22] Filed: Jun. 27, 1997

[51] Int. Cl.[6] .................................................. H03M 13/00
[52] U.S. Cl. ........................ 714/752; 371/37.6; 370/60.1
[58] Field of Search ................................ 371/37.01, 37.6, 371/37.1; 370/60.1

[56] References Cited

U.S. PATENT DOCUMENTS

| | | | |
|---|---|---|---|
| 3,872,430 | 3/1975 | Boudreau et al. | 340/146.1 |
| 4,593,393 | 6/1986 | Mead et al. | 371/37 |
| 4,712,215 | 12/1987 | Joshi et al. | 371/37 |
| 4,723,243 | 2/1988 | Joshi et al. | 371/37 |
| 5,251,215 | 10/1993 | Dravida et al. | 370/94.1 |
| 5,280,476 | 1/1994 | Kojima et al. | 370/60.1 |
| 5,282,215 | 1/1994 | Hyodo et al. | 371/42 |
| 5,313,454 | 5/1994 | Bustini et al. | 370/13 |
| 5,325,372 | 6/1994 | Ish-Shalom | 371/37.6 |
| 5,379,297 | 1/1995 | Glover et al. | 370/60.1 |
| 5,410,546 | 4/1995 | Boyer et al. | 371/37.1 |
| 5,450,399 | 9/1995 | Sugita | 370/60.1 |
| 5,452,330 | 9/1995 | Goldstein | 375/257 |
| 5,790,842 | 8/1998 | Charles et al. | 395/559 |
| 5,793,427 | 8/1998 | Mills et al. | 348/391 |

*Primary Examiner*—William Grant
*Assistant Examiner*—McDieunel Marc
*Attorney, Agent, or Firm*—Joscelyn G. Cockburn

[57] ABSTRACT

Described is a method and apparatus which calculates Cyclic Redundant Check (CRC) for an entity from partial CRCs associated with segments of the entity. The entity includes a data packet segmented into a plurality of Asynchronous Transfer Mode (ATM) cells. The Packet CRC is calculated from the algorithm $(A_1C_1+A_2C_2 \ldots +A_NC_N)/P$ with $A_i$, $i=1, \ldots, N$, representing a partial CRC associated with a particular ATM cell, $C_i$, $i-1, \ldots, N$, representing a Fixed Remainder and P is the CRC generation polynomial. The $C_i$ values are calculated and stored in a table. The partial CRCs (i.e., $A_i$'s) are calculated by hardware generator and forwarded to a processor which selects the corresponding value of $C_i$ from the table and generates the CRC for the frame.

16 Claims, 7 Drawing Sheets

FIXED REMAINDERS TABLE (FOR ATM)
FR(X) - PRECOMPUTED

| | REMAINDERS OF |
|---|---|
| X = 1 | $2^{384(L-1)} / P$ |
| 2 | $2^{384(L-2)} / P$ |
| 3 | . |
| . | . |
| . | . |
| . | . |
| L-2 | $2^{768} / P$ |
| L-1 | $2^{384} / P$ |
| L | $1 / P$ |

FIG. 6A

PARTIAL CRC TABLE $T_B$
(FOR PACKET B)

| $B_i$ = 1 | PARTIAL CRC 1 |
|---|---|
| 2 | PARTIAL CRC 2 |
| 3 | . |
| . | . |
| . | . |
| M | PARTIAL CRC M |

METHOD OF PARTITIONING CRC CALCULATION FOR A LOW-COST ATM ADAPTER

BACKGROUND OF THE INVENTION

1. Field of the Invention

The present invention relates to Local Area Network (LAN) communications systems in general and, in particular, to devices which allow network entities to process information in a first format or protocol and transfer the information in different formats or protocols.

2. Prior Art

The use of LAN communications systems for interconnecting Data Terminal Equipment (DTE), such as computers, word processors, printers, file servers, etc., are well known in the prior art. The most popular LAN communications systems used to interconnect DTEs probably includes Token Ring, Ethernet and Asynchronous Transfer Mode (ATM). These networks have different characteristics and it is desirable to have programs and/or other data structure designs for one type of network to be compatible with the others.

One area of incompatibility is in the size of the data block. The Token Ring and Ethernet networks are deemed to be packet oriented networks. The size of the data packets varies from a minimum value to a maximum value. In contrast, the ATM network uses a fixed size data entity called a cell. The ATM cell size is usually fifty-three (53) bytes. Of the 53 bytes, 48 are used for data and the other five bytes are used for virtual routing information.

It appears as if the number of installed Token Ring and/or Ethernet networks are much greater than the number of installed ATM networks. As a consequence, a large number of application programs structure data in a packet size compatible with the Token Ring and/or Ethernet packet size. In order for ATM to compete successfully with Ethernet and/or Token Ring as a desktop technology, a low cost device for segmenting packet size frames is required. The present invention provides such a low cost device.

In order to transmit over an ATM link, user data structured in accordance with Ethernet and/or Token Ring packet size, each unit of user data is segmented into a plurality of ATM cells. Prior to segmentation, a Trailer Data Field and a 32-bit CRC are concatenated to the user data. The user data, Trailer and 32-bit CRC form an ATM packet which is segmented in ATM cells and transmitted over the ATM link. This method of handling data is fully described in the ATM Adaption Layer-5 (AAL-5). The AAL-5 is well documented in ATM literature and further description is not warranted.

One of the consequences of segmentation is that multiple streams of ATM cells each associated with different ATM packets will often be interleaved. One approach is to use an hardware design. The hardware required to decode and associate each ATM cell with its respective stream and maintain multiple CRC calculation (one for each stream) is complex and expensive. Another approach to calculating the CRC (termed "Packet CRC") associated with an ATM packet is to use the system software. The approach has several drawbacks including considerable performance penalty. In particular, to calculate Packet CRC for ATM packets entirely with system software requires an extremely large amount of system CPU cycles.

In view of the above, an efficient and low cost system for calculating Packet CRC is required.

SUMMARY OF THE INVENTION

It is, therefore, an object of the present invention to provide a low cost and high performance system for coupling a Personal Computer (PC), word processor or similar machine to an ATM link.

The system includes an ATM Network Interface Card (NIC) and a programmed processor. The processor partitions a packet into ATM cells which are forwarded to the NIC which calculates a CRC for each ATM cell. The ATM cells are transmitted over the link to a destination device and the associated CRCs are returned for further processing by the processor. The processor calculates the packet CRC for a packet from the partial CRCs associated with ATM cells of the packet. In general, each partial CRC associated with an ATM cell of a packet is multiplied by an appropriate $R_i$, where $R_i$ represents a fixed remainder. The appropriate $R_i$ depends on the offsets of the ATM cell for which the partial CRC was calculated, within the entire packet.

A running sum of the partial CRCs and associated fixed remainders is calculated and divided by a two's complement division to yield the packet CRC.

On the Receive channel of the NIC, the ATM cells are received from the ATM link. The hardware calculates the CRC for each cell and forwards it to the processor which keeps track of the running sum of partial CRCs and calculates a Packet CRC. The calculated Packet CRC is then compared with the received CRC to determine if an error has occurred in the transmission.

By leveraging packet CRC calculation between the processor and hardware, a robust and efficient Network Interface system is provided.

BRIEF DESCRIPTION OF THE DRAWINGS

FIG. 2, comprising of FIGS. 2A and 2B, shows a block diagram of a Data Terminal Equipment (DTE) in which the teachings of the present invention are incorporated.

DESCRIPTION OF THE PREFERRED EMBODIMENT

Figure 1:
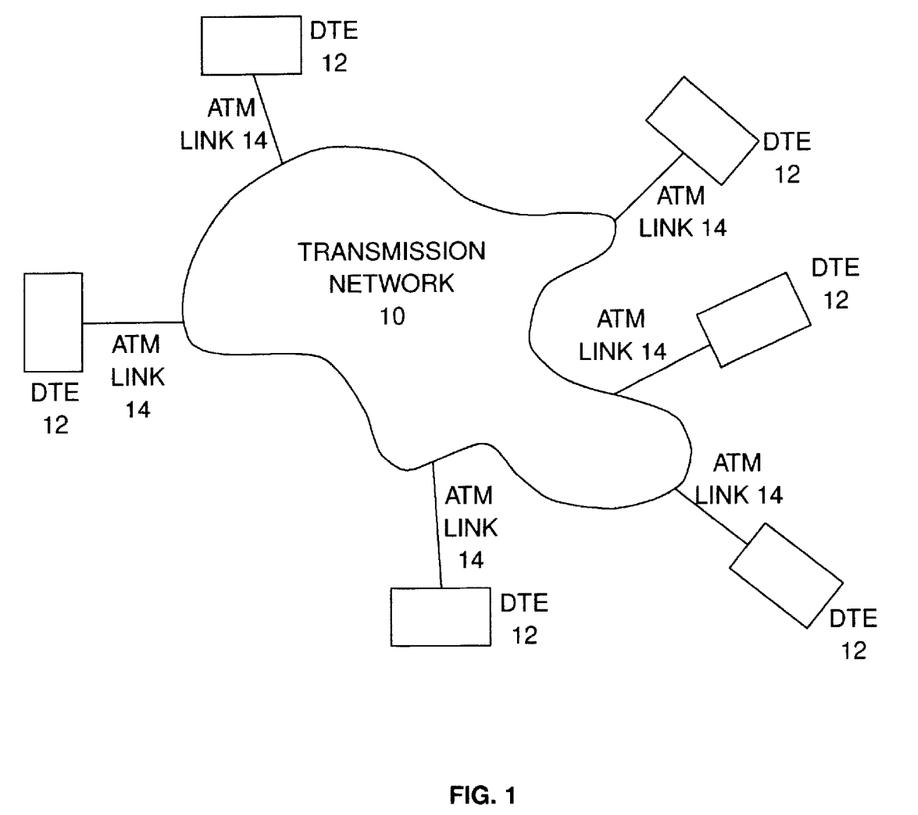
FIG. 1 shows a block diagram of a Communications Network in which the present invention can be used.

FIG. 1 shows a communications system embodying the teachings of the present invention. The communication system includes a Transmission Network 10 interconnected by a plurality of ATM Links 14 to respective Data Terminal Equipment 12. The Transmission Network 10 provides the infrastructure for interconnecting the DTEs. The Transmission Network 10 may include an ATM network together with other types of networks. The other types of networks may be Local Area Network (LAN), Wide Area Network (WAN), telephone systems, etc. Since these different types of interconnecting networks are well known in the art, further description will not be given here. The DTEs 12 can be any of the well known data terminal equipment. Such equipment may include personal computers, word processors or the like. Each of the Data Terminal Equipment 12 transmits and receives information, format in accordance with the ATM protocol, over the ATM Link 14.

Figure 2A:
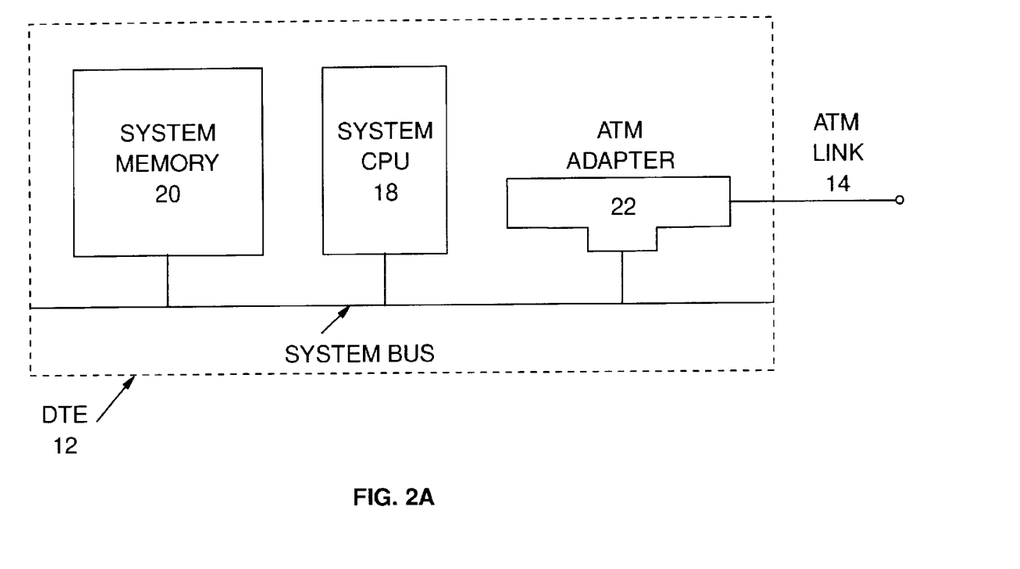
Figure 2B:
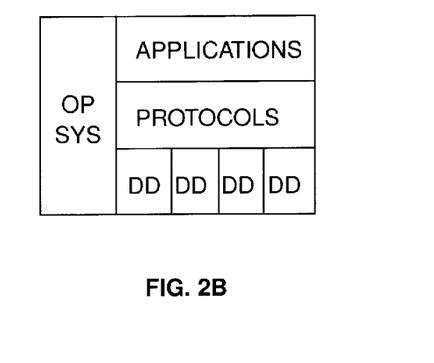

FIG. 2A shows a block diagram of the Data Terminal Equipment 12. For brevity, common components throughout the figures are identified by the same numeral. Each DTE 12 includes a System Bus 16, a System CPU 18, System Memory 16 and ATM Adapter 22. The ATM Adapter couples the system bus to the ATM Link 14. In this document, ATM adapter and ATM Network Interface Card (NIC) are used interchangeably. The DTE 12 also includes system software which cooperates with the ATM adapter in processing data received from and transmitted onto the ATM link 14. The system software includes ATM Adapter Device Drivers (DD), communication protocol stacks, an operating system, and user's application program running on top of the device driver. FIG. 2B shows the Operating System, Device Drivers (DD), Protocols and the application programs for the DTE 12 shown in FIG. 2A. These components assist in processing the information necessary to transmit and receive data from the ATM link.

Figure 6A:
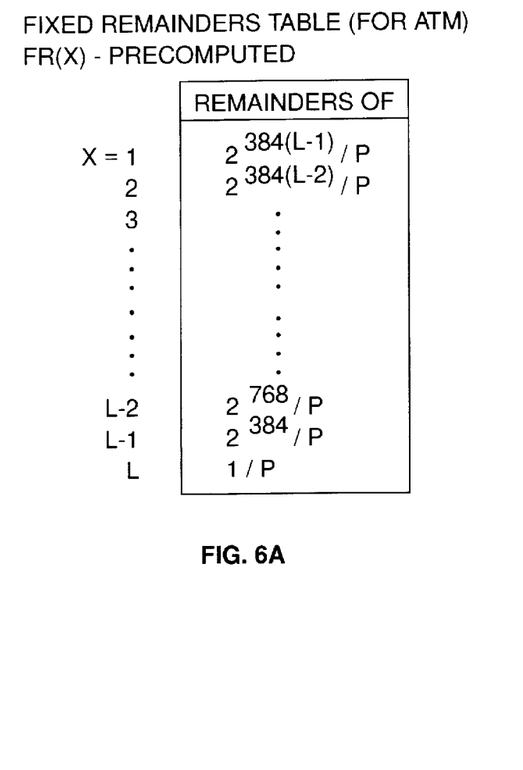
FIGS. 6A and 6B show the Fixed Remainder Table and partial CRC table used in the present invention.
Figure 6B:
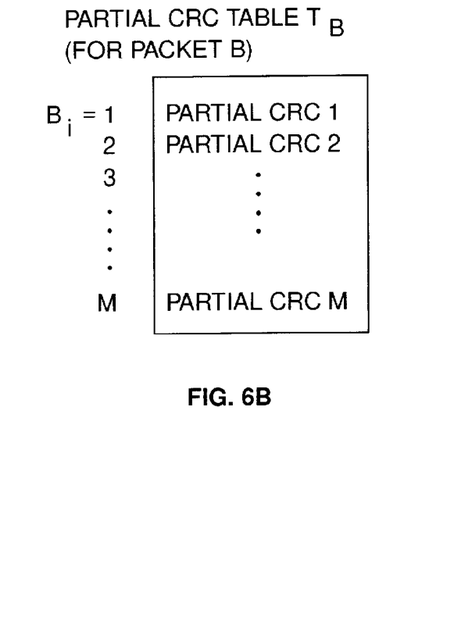
Figure 6C:
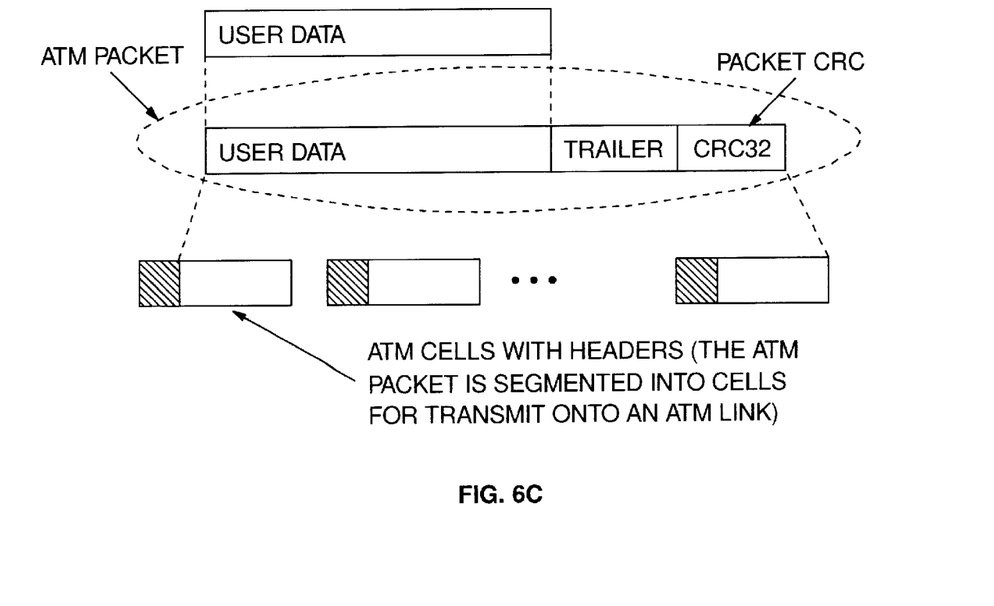
FIG. 6C shows data structure for ATM Packet and ATM cells.

Turning to FIG. 6C for the moment, a schematic of data structure as it appears in the system CPU and/or System Memory 20 is shown. The data structure includes a user data block which is provided by a user application program. The system CPU adds the trailer and a 32-bit Cyclic Redundant Check (CRC32), as described below. The system then partitions the ATM packet into ATM cells which are forwarded to the ATM Adapter 22 for further processing in accordance with the present invention. As is well known in the art, the ATM cell has 53 bytes, including 48 data bytes and 5 ATM header bytes which are used for routing throughout the system or network. As will be described hereinafter, the teachings of this invention breaks up the function of generating the CRC between the system CPU and the hardware in the ATM Adapter 22. In essence, the ATM Adapter 22 calculates the partial CRC for each cell, returns it to the CPU, which in turn calculates a combined Packet CRC based upon the partially received CRCs. Details of the implementation and function will be given subsequently.

Figure 3:
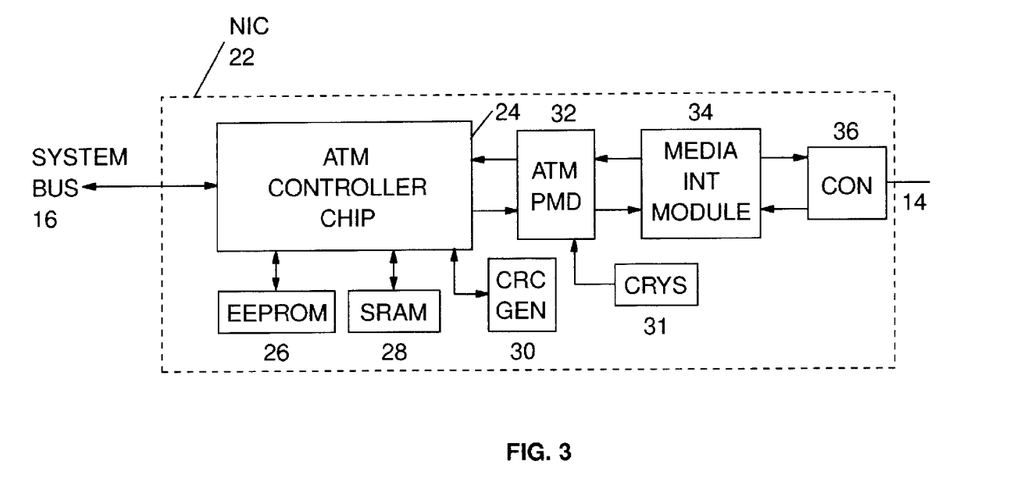
FIG. 3 shows a functional block diagram of a Network Interface Card (NIC) according to the teachings of the present invention.

FIG. 3 shows a functional diagram of NIC 22. The NIC 22 couples System Bus 16 to the ATM link 14. The NIC 22 includes ATM Controller Chip 24, EEprom 26, SRAM 28, CRC Generator 30, ATM PMD 32, Media Interface Module 34, and Connector 36. The named components are interconnected by appropriate transmission lines as shown in the figure. The ATM Controller Chip 24 embodies the ATM Adaptation Layers AAL 1 (optionally) and AAL 5. These adaptation layers are architectured in the ATM standard and details will not be given here. The ATM layer accepts and delivers ATM cell payloads from and to the various ATM adaptation layer based upon VPI/VCI values incorporated in the header of the ATM cell. In the embodiment of the ATM Controller Chip 24 are two processors, one of which is used to control transmission onto the ATM link and the other for receiving data from the ATM link. The EEPROM attaches to a serial interface and contains vital product data, default parameters, and configuration data. Each time the ATM controller receives the preset signal, the contents of the EEPROM are read into internal control registers.

The design is for 25 Mbps and is suitable for use in a desktop machine. A more detailed description is given in MicroNews (First Quarter 1997, Vol. 3, No. 1), a publication of IBM Microelectronics Division. It should be noted that other types of designs, including those for 155 Mbps, can be made without deviating from the spirit and scope of the present invention.

The ATM PMD 32 Module contains line drivers, line receiver, line equalizer and phase locked loop clock recover circuits. This modules also contains 3.3 V regulator/oscillator synthesizer circuits for use by the ATM controller. The SRAM 28 contains control data structures and queues for communication with the host system and data buffering. The Connector 36 is used for connecting to the ATM Link 14. Clocking signals are provided by Crystal (CRYS) 31.

Still referring to FIG. 3, and as discussed above, applicants' invention includes a leveraging of CRC generation over the system processor and the NIC 22. To this end, a CRC generator 30 is provided on NIC 22. Even though the CRC generator 30 is shown as a separate standalone block, it could be integrated as part of the ATM controller chip. The CRC generator is a standard 32-bit generator which is used for generating a 32-bit CRC for each of the ATM cells received from the system processor. By way of example, an appropriate CRC generator is disclosed in U.S. Pat. No. 3,872,430, entitled "Method and Apparatus of Error Detection for Variable Length Words Using a Polynomial Code". The subject patent is incorporated herein by reference. As will be discussed in greater detail below, the CRC Generator 30 calculates the partial CRC and returns the partial CRCs to the system processor which keeps track of the various ATM packets to which a particular cell belongs. The system processor uses the partial CRCs to calculate the packet CRC which it returns to the ATM adapter which transmits it onto the ATM link. It should also be noted that in addition to calculating and returning the CRCs for ATM cells, the adapter transmits the ATM cells onto the ATM link. In addition, the ATM adapter also receives ATM cells from the ATM link. The CRCs are calculated for receive and transmit ATM cells.

As part of the CRC calculation, the system software keeps, among other things, two tables within the system memory. One of the tables is a Partial CRC Table ($T_B$) shown in FIG. 6B and the other is the Fixed Remainders Table shown in FIG. 6A. These tables are kept in system memory or other desirable location. With respect to the Partial CRC Table ($T_B$), B represents the packet length and $B_i$ represents cell blocks in the packet. With this notation, 1 represents the first ATM cell in the packet, 2 represents the second, and so on with M representing the last ATM cell in the packet B. For each entry in the table, there is a Partial $CRC_i$. With this notation, partial $CRC_1$ corresponds to the CRC for the first ATM cell in a packet, partial $CRC_2$ represents the second, and so forth while partial $CRC_M$ represents the CRC for the last ATM cell in the packet. As discussed above, these partial CRCs are calculated by the CRC Generator 30 (FIG. 3) in the NIC and returned to the system processor.

FIG. 6A shows the Fixed Remainder Table. Each value in this table is pre-computed by the processor and relates to the position of the data portion of the ATM cell within the ATM cells forming a particular packet. In the table, the column (outside of the block) labeled X=1 through L represents the position of ATM cells within the ATM packet. L is the maximum packet length in cells. In addition, the length of the data portion of an ATM cell is 48×8 bits=384, with 48 being the number of data bytes and 8 being the number of bits in a byte. With respect to FIG. 6A, the Fixed Remainder for the first ATM cell in a ATM packet is the remainder of $2^{384(L-1)}$ when divided by P, where L represents the maximum packet length in cells. The second entry in the table is the corresponding remainder of $2^{384(L-2)}$ and so forth. When calculating the CRC using the Fixed Remainder Table, (L−P+i) is the offset to the desired fixed remainder for cell $B_i$ where P is the length of packet B in cells.

Based upon the above description so far, in order to calculate the CRC for a packet, the partial CRC from the hardware is multiplied by the corresponding fixed remainder in the table and a running sum of all the products of the partial CRCs and fixed remainders are taken. The remaining sum is then divided by two's complement to find the CRC for the packet. Stated another way, partial CRC refers to the CRC for a 48-byte cell, computed by the adapter hardware. In order to combine these partial CRCs into a CRC for the entire packet (which is segmented across multiple cells), the inventors use the described procedure. In essence, we compute a table of "Fixed Remainders" $R_N$ and a table of partial CRCS, $R_i$.

Each partial CRC is multiplied by the appropriate $R_i$ and adding the result to the running sum. The appropriate $R_i$ depends on the offset of the cell for which the partial CRC was computed within the entire packet.

In order to explain the teaching of the present invention, a practical example will be given. For example, if a packet was 480 bytes long, when only data bytes are taken into account (10 cells, or 3840 bits), the first partial CRC would be multiplied by the Fixed Remainder of $2^{9(48+8)}$, since there are nine cells to the right of it, each 48 times 8 bits long. This multiplication allows us to account for the position of each cell in the packet. Finally, when the multiplication and sum for every partial CRC is done, we are left with a 64 bit result. A two's complement division of this result yields the packet CRC.

Figure 4:
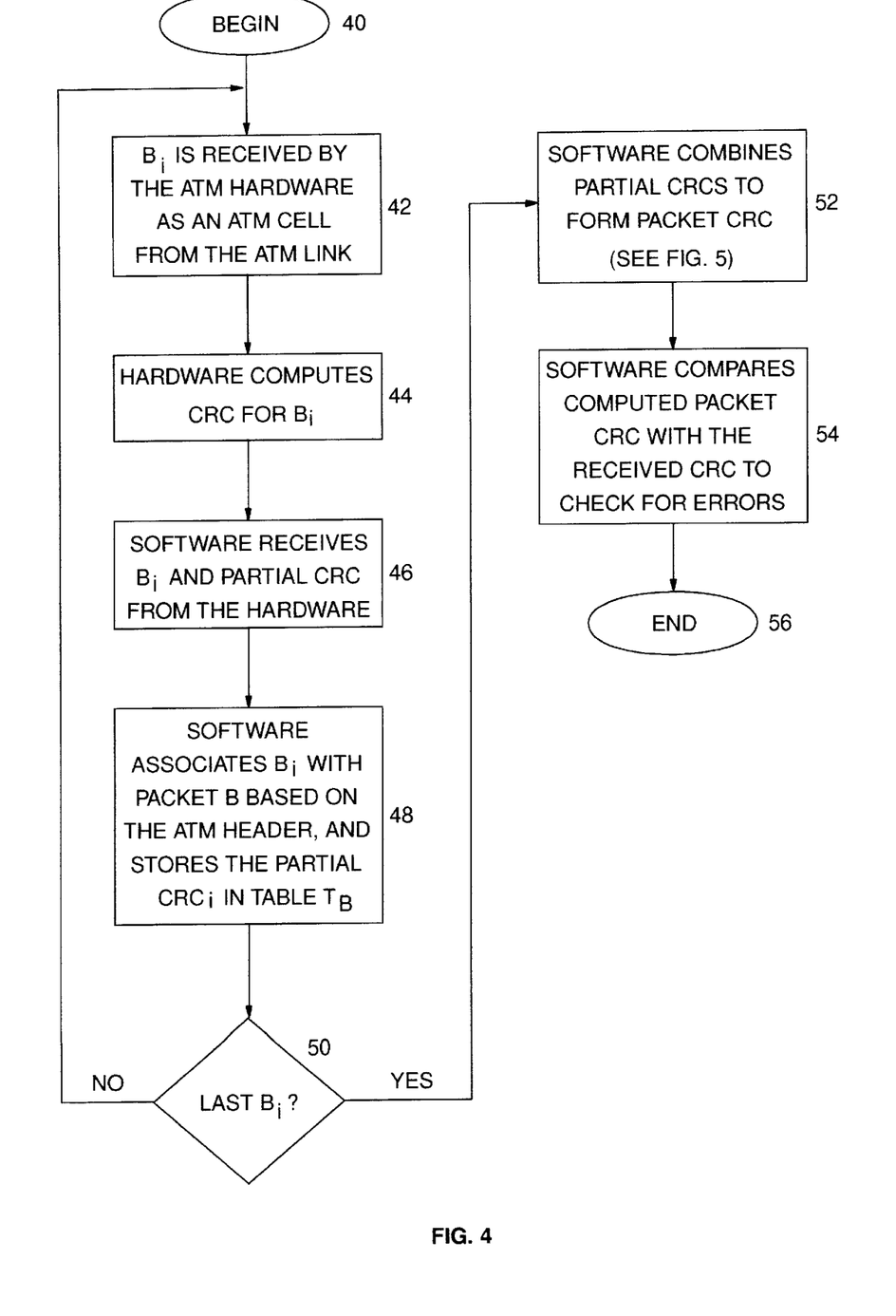
FIG. 4 shows a flowchart of the method according to the teachings of the present invention to process ATM packets received from an ATM link.

FIG. 4 shows a flowchart for processing an ATM packet received from the ATM Link 14. The first block in the process is the entry block identified by numeral 40. From block 40, the program descends into block 42 in which the ATM adapter receives an ATM cell $B_i$ from the ATM link. The program then descends into block 44 where the CRC generator calculates the CRC for ATM cell $B_i$. The program then descends into block 46 where the software receives $B_i$ and the partial CRC from the hardware. The program descends into block 48. Based upon the ATM header, the program associates the $B_i$ with the proper packet B and stores the partial CRCs in Table $T_B$. The program then descends into decisional block 50 where it tests to see if this $B_i$ is the last $B_i$ for the packet. If it is not, the program loops back to block 42 and repeat the process steps previously described. It should be noted that the hardware puts appropriate markings in the last $B_i$ CRC which the program receives.

Still referring to FIG. 4 and block 50 in particular, if $B_i$ is the last $B_i$, the program then enters block 52 where the program uses the method discussed above and, hereinafter, to combine the partial CRCs into packet CRC which is compared with the CRC received from the link (block 54) to check for errors. The program then exits the routine in the end block 56.

Figure 7:
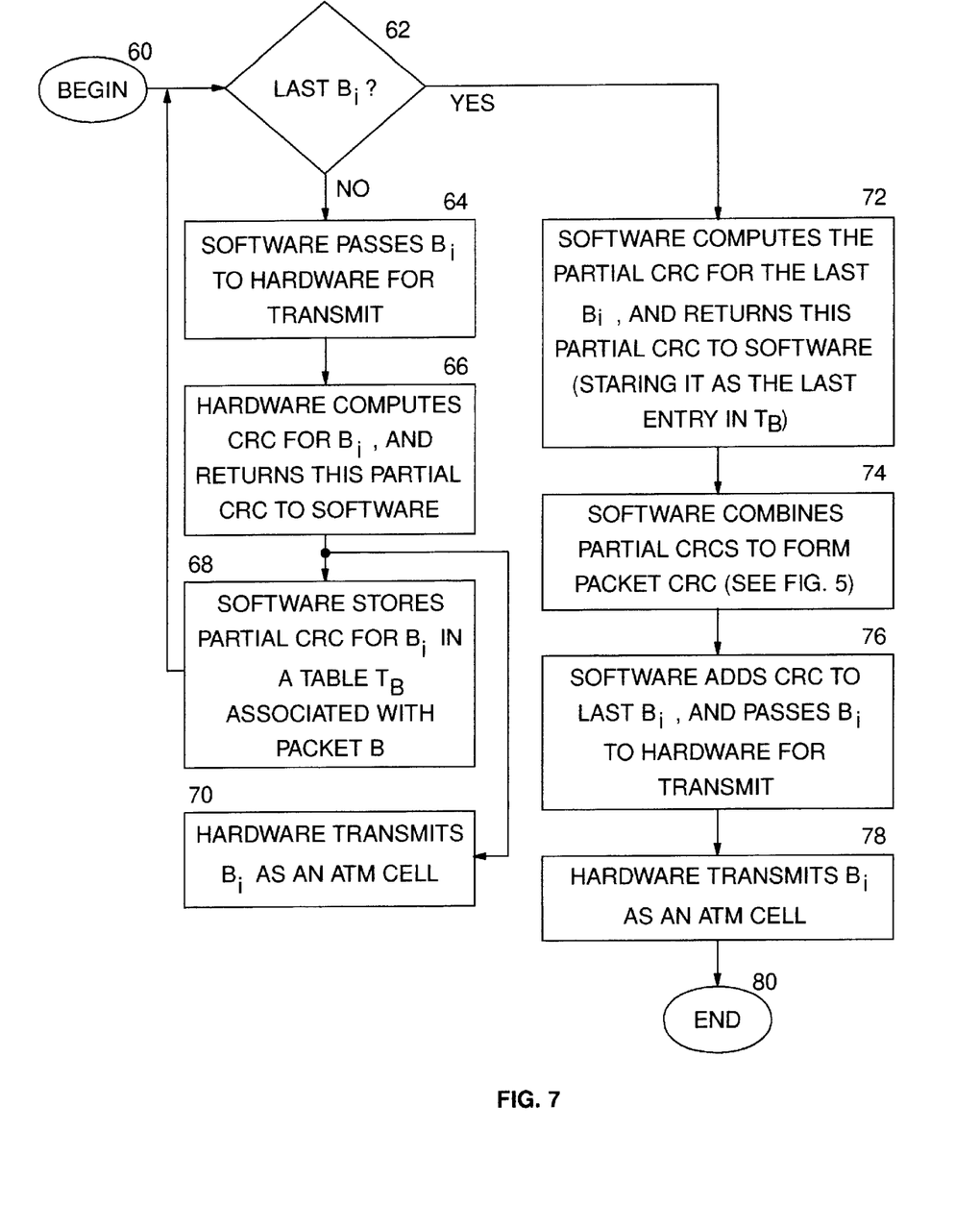
FIG. 7 shows a flowchart for processing ATM cells transmitted on the ATM link.

FIG. 7 shows a flowchart for ATM packet transmit to the ATM link. Block 60 represents the first block in this process where the program begins. The program then enters decision block 62 where the program tests to see if this is the last packet $B_i$ of the ATM packet. If it is not the last packet, the program descends into block 64 where the software passes $B_i$ to hardware for transmit. The program then descends into block 66 where the hardware computes CRC for $B_i$ and returns this partial CRC to the software. The program then descends into block 68 where the software stores the partial CRC for $B_i$ in Table $T_B$ associated with packet B. It should be noted that the software is keeping track of each packet that is to be transmitted and in addition where in a particular table a particular CRC is stored. The program then enters a loop back to block 62. In addition to sending the CRC from block 66 to the software, the program also sends the subsegment $B_i$ as an ATM cell over the ATM link block 70.

Still referring to FIG. 7 and in particular to block 62, if the $B_i$ is the last one, the program enters block 72 where the software computes the partial CRC for the last $B_i$ and returns this partial CRC to the software, storing it as the last entry in the $T_B$ table. The program then descends into block 74 where it combines the partial CRC to form the packet CRC. The procedure used in calculating this and combining the partial CRCs to form the packet CRC is discussed above and below in a more general way. The program then descends into block 76 where the program adds CRC to the last $B_i$ and passes $B_i$ to the hardware for transmission. The program then descends into block 78 where the hardware transits $B_i$ as an ATM cell and ends the process in block 80.

Figure 5:
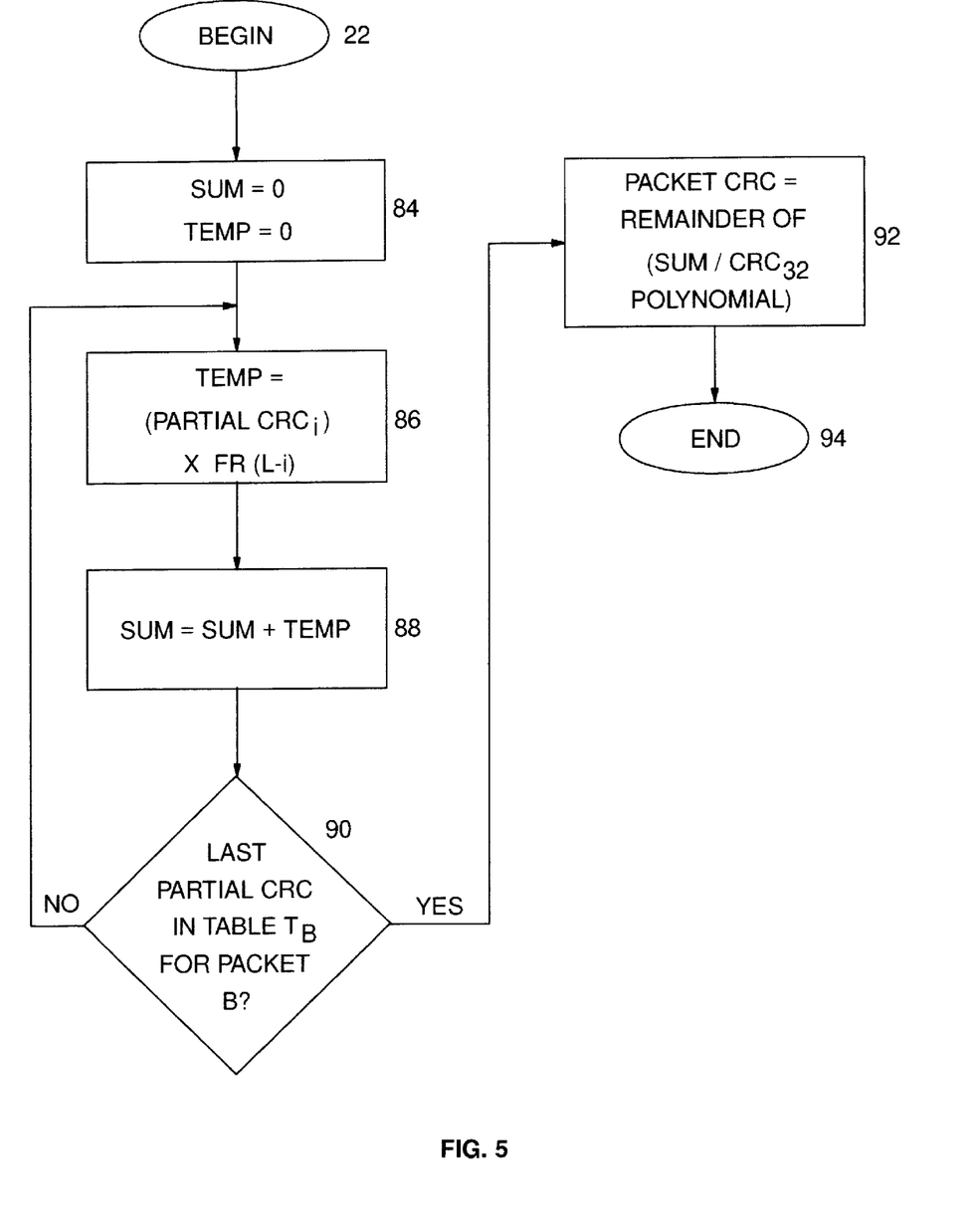
FIG. 5 shows a flowchart of a method according to the teachings of the present invention to combine partial CRC into a packet CRC.

FIG. 5 shows a flowchart of a computer program used by the processor in combining the partial CRCs into a packet CRC. To do this, the program keeps track of a running sum of the product of the partial calculated CRC and related fixed remainders. The value from the running sum is divided by two's complement to form the combined CRC. Returning again to FIG. 5, block 82 represents the entry block of the process. The program then descends into block 84 where two parameters termed "SUM" and "TEMP" are set to zero. The program then descends into block 86 where the value of TEMP is computed using the algorithm in block 86. The program then descends into block 88 where SUM is calculated using the algorithm for SUM. The program then descends into decisional block 90 where the program tests to see if this is the last partial CRC in table $T_B$ (FIG. 6B) for packet B. If no, the program loops back to block 86 and computes the algorithm in blocks 86, 88 and 90. If yes, the program enters block 92 where the packet CRC is calculated from SUM/CRC 32 polynomial. The program then ends in block 94. In FIG. 5, it should be noted that the multiplied procedure in block 86 is a 32-bit multiply. The addition in block 88 is a 64-bit add with no carry. The divide operation in block 92 is a 64-bit divide; with the CRC 32 polynomial described above and generally described in the general example set forth below. FR(i) is a fixed remainder set forth in the Fixed Remainder Table (FIG. 6A). L is the maximum packet and partial $CRC_i$ is the $i^{th}$ entry in table $T_B$, the partial CRC table for packet B as discussed above.

APPENDIX

This appendix sets forth a general method of combining Partial CRCs into a Packet CRC.

An n-bit cyclic redundancy check (CRC) frame check sequence (FCS) pattern can be computed for a k-bit message M by dividing M $2^n$ by an (n+1)-bit pattern P. For IEEE standard CRC32, modulo-2 division is used and P is defined in polynomial form as:

$$X^{32}+X^{26}+X^{23}+X^{16}+X^{12}+X^{11}+X^{10}+X^8+X^7+X^5+X^4+X^2+X+1$$

Following the notation and methods described on page pages 143–149 in *Data and Computer Communications*, fourth edition, by Bill Stallings, we define:

T=(k+n)-bit frame to be transmitted

M=k-bit message, the first k bits of T

F=n-bit pattern FCS, the last n bits of T

P=(n+1)-bit pattern that is the CRC generation polynomial

Then, given a block B that is segmented into j-bit sub-blocks, $B_i$ where i=1, 2, ..., m and is integer, it is desired to compute the CRC32 as efficiently as possible. The figure below shows block B, and its sub-blocks, $B_i$.

Sub-blocks $B_1$, could, for example, be ATM cells. We wish to compute F=Remainder ($B/P$) where, $B=M \cdot 2^n$ for transmit messages and B=T for receive messages (note that "·" is multiplication). That is, for transmit messages we wish to generate an FCS and for receive messages we wish to check the FCS by verifying that Remainder ($B/P$) is zero.

The following implementation is assumed.

```
recv  xmit
 !     A
 V     !
+-----+--+
|  hardware  |
+--+------+
   !  A
   V  !
+--+------+
| software |
+--+------+
   !  A
   V  !
+--+------+-+
| message buffers |
+-------------+
```

— Communications link
— Communications adapter
— System bus
— System CPU and memory This implementation has the following constraints:

(a) For a given block B, not all sub-blocks $B_i$ will be contiguously received or transmitted.

(b) Hardware can compute CRC 32 (or some other function) on individual sub-blocks $B_n$ but cannot compute CRC32 for an entire block B due to constraint (a) above.

(c) Software computation must be minimized. Computing CRC32 entirely in software for a Block B is considered unacceptable.

The solution uses the following properties of remainders for modulo-2 (with no carries) division. For any positive integers $A_i$ where i=1, 2, ..., m, and P, $$\text{Remainder}\left(\frac{\sum_i A_i}{P}\right) = \text{Remainder}\left(\frac{\sum_i R_{A_i}}{P}\right), \text{ and} \quad (1)$$

$$\text{Remainder}\left(\frac{\prod_i A_i}{P}\right) = \text{Remainder}\left(\frac{\prod_i R_{A_i}}{P}\right), \quad (2)$$

where $$R_{A_i} = \text{Remainder}\left(\frac{A_i}{P}\right).$$

Then, we can solve for F=Remainder ($B/P$) by, $$\text{Remainder}\left(\frac{B}{P}\right) = \text{Remainder}\left(\frac{\sum_{i=1}^{m}(R_{B_r} \cdot R_{2^{(m-i)j}})}{P}\right), \quad (3)$$

where $$R_{2^{(m-i)j}} = \text{Remainder}\left(\frac{2^{(m-i)j}}{P}\right) \text{ for } i = 1, 2, ..., m,$$

which terms can be pre-computed and then used as constants in equation (3).

The split between hardware and software function for receive where B is the received frame T is:

1) The hardware returns to the system a remainder $R_{B1}$ for each sub-block $B_1$ received for i=1, 2, ..., m.

2) When the last sub-block remainder, $R_{Bm}$, has been received, then solve for Remainder ($B/P$) in software using equation (3).

3) If Remainder ($B/P$) is zero, then the frame comprising block B has been received with no apparent errors.

The split between hardware and software function where Block is $M \cdot 2^n$ is:

1) The hardware returns to the system a remainder $R_{B1}$ for each sub-block $B_1$ transmitted for i=1, 2, ..., m.

2) For the last sub-block, $B_m$, software computes the remainder, $R_{Bm}$, then solves for Remainder ($B/P$) using equation (3).

3) The result from Remainder ($B/P$) is inserted in the last sub-block $B_m$, as the FCS for block B.

We note that using equation (3) requires only one software division to compute the CRC for block B. Existing all-software methods for computing CRC require at least one division per "word" in a block, where a "word" is the largest data unit supported by the processor executing the software.

It should be expressly understood that the claimed invention is not to be limited to the description of the preferred embodiment, but encompasses other modification and alternations within the scope and spirit of the inventive concept.

We claim:

1. A method for use in a communications system comprising the steps of:

(a) receiving segments ($B_i$) of a packet (B), with i=1, 2, 3, ..., n;

(b) for each of the segments received, calculating a partial $CRC_i$ (i=1, 2, ... n);

(c) storing each partial $CRC_i$ in a computer storage;

($c_1$) providing a table of Remainders with each Remainder having a predetermined relationship with each partial $CRC_i$;

(d) using a computer to access the computer storage and the table; and (e) combining partial CRC's from the computer storage with related Remainders from the table to form the packet CRC's.

2. The method of claim 1 further including the steps of:

(f) receiving, from the communication system, a packet CRC for said packet; and comparing the received packet CRC with the calculated CRC to check for errors.

3. The method of claim 1, wherein the step of combining Partial CRCs further includes the steps of:

using the computer to calculate sets of products of selectively paired Fixed Remainder (FR) and partial CRC;

using the computer to calculate a value of a running sum of all the FR×CRC in the packet; and using the computer to execute a two's compliment division on the value with the result being the packet CRC.

4. A method for use in processing and transmitting users information over an ATM link comprising the steps of:

(a) generating an ATM packet from the user information;

(b) partitioning the ATM packet into ATM cells;

(c) using a hardware generator, calculating a partial CRC for each ATM cell;

(d) using a programmed computer, storing the partial CRCs in a table;

(e) using the programmed computer, generating a set of Fixed Remainders with each Fixed Remainder in the set of Fixed Remainders corresponding to a partial CRC in the table;

(f) using the programmed computer, generating a value formed from an expression including summed products of selected CRCs and corresponding Fixed Remainders; and (g) using the programmed computer for generating a packet CRC from said value.

5. The method in claim 4 further including the steps of transmitting each ATM cell onto the ATM link following calculation of the CRC for the ATM cell; and transmitting the packet CRC as an ATM cell.

6. The method of claim 4 further including the steps of:

(h) using the programmed computer to add the packet CRC to the last segment of the packet; and (i) transmitting the sum from step (h) onto the ATM link.

7. The method of claim 4 wherein the packet CRC is being generated by a two's complement division of the value calculated in step (f).

8. A method for generating a Packet CRC for an ATM packet B segmented into ATM cells $B_i$ (i=1, 2, . . . n) including the following steps:

(a) receiving an ATM cell $B_i$ from an ATM link;

(b) calculating a partial $CRC_i$ for said $B_i$ using a hardware CRC generator;

(c) returning said partial $CRC_i$ and said ATM cell $B_i$ to software loaded in a computer;

(d) associating said $B_i$ with packet B;

(e) storing said partial $CRC_i$ in a table $T_B$;

(f) repeating steps (a) to (e) until said partial $CRC_i$ of all said ATM cells $B_i$ have been stored in said table $T_B$;

($f_1$) providing a table of remainders with each remainder being related to each partial $CRC_i$ and (g) combining selected partial $CRC_i$s with selected remainders to form the packet CRC for said ATM packet B.

9. The method of claim 8 further comprising the step of:

(h) comparing said combined packet CRC with the CRC calculated by said software to check for errors.

10. A method for transmitting an ATM packet B comprising the following steps:

(a) partitioning said ATM packet B into sub-blocks $B_i$ by software executed in a computer;

(b) passing a sub-block $B_i$ to hardware;

(c) calculating a partial $CRC_i$ for said sub-block $B_i$ within said hardware and returning said partial $CRC_i$ to the software;

(d) transmitting said sub-block $B_i$ as an ATM cell by said hardware;

(e) storing said partial $CRC_i$ in a Table $T_B$ associated with ATM packet B by said software;

(f) repeating steps (b) to (e) until all, except the last sub-block $B_i$ of the partial $CRC_i$ of the ATM packet B have been calculated and stored;

(g) calculating the partial $CRC_i$ for the last sub-block $B_i$ within said software, returning said last partial $CRC_i$ to said software and storing said last partial $CRC_i$ in said table $T_B$ as the last value entered;

($g_1$) providing a table of remainders;

(h) combining selected partial $CRC_i$s with selected remainders to form a packet CRC for said ATM packet B;

(i) adding said packet CRC to said last sub-block $B_i$ and passing said last sub-block $B_i$ to said hardware; and (j) transmitting said last sub-block $B_i$ as an ATM cell by said hardware.

11. The method set forth in claims 1 or 4 or 8 or 10 wherein the table of remainders is precomputed.

12. A system for use to connect a computer, word processor or similar device to a communications network comprising:

a memory in which a table of Fixed Remainders and a table of partial CRCs are being stored;

a hardware generator executing an algorithm to generate partial CRCs for ATM cells; and a programmed processor for receiving and storing the partial CRCs in the table of partial CRCs, said programmed processor combining selected entries from the table of partial CRCs with selected entries from the table of Fixed Remainders to generate a packet CRC for a packet of information.

13. The system of claim 12 wherein the table of fixed remainders are precomputed.

14. A system for use to coupling a Data Terminal Equipment (DTE) to an Asynchronous Transfer Model (ATM) link comprising:

a network interface card (NIC) including Cyclic Redundant Check (CRC) generator for generating partial CRCs for ATM cells associated with a data packet, received in said NIC;

a memory including a table in which a set of remainders is being stored; and a programmed computer for correlating selected partial CRCs with selected remainders from said table to generate a packet CRC for said packet.

15. The system of claim 14 wherein the programmed computer includes a processor in the Data Terminal Equipment.

16. The system of claim 14 wherein the table of remainders is precomputed.

* * * * *